(12) United States Patent
Brooks et al.

(10) Patent No.: US 7,834,718 B2
(45) Date of Patent: Nov. 16, 2010

(54) SIGNAL MODULE WITH REDUCED REFLECTIONS

(75) Inventors: William Michael Brooks, Scotts Valley, CA (US); Antho N. Vu, San Jose, CA (US)

(73) Assignee: inTEST Corporation, Cherry Hill, NJ (US)

( * ) Notice: Subject to any disclaimer, the term of this patent is extended or adjusted under 35 U.S.C. 154(b) by 386 days.

(21) Appl. No.: 11/721,492

(22) PCT Filed: Dec. 9, 2005

(86) PCT No.: PCT/US2005/044730

§ 371 (c)(1),
(2), (4) Date: Feb. 7, 2008

(87) PCT Pub. No.: WO2006/065669

PCT Pub. Date: Jun. 22, 2006

(65) Prior Publication Data

US 2008/0273201 A1 Nov. 6, 2008

Related U.S. Application Data

(60) Provisional application No. 60/635,642, filed on Dec. 13, 2004.

(51) Int. Cl.
*H01R 13/00* (2006.01)

(52) U.S. Cl. ........................................ 333/33; 333/260

(58) Field of Classification Search .................. 333/33, 333/34, 260, 254; 439/607, 608, 638
See application file for complete search history.

(56) References Cited

U.S. PATENT DOCUMENTS

| | | | |
|---|---|---|---|
| 3,310,358 A | 3/1967 | Marcatili | |
| 3,437,960 A | 4/1969 | Ziegler, Jr. | |
| 3,750,086 A * | 7/1973 | Iversen ....................... | 439/264 |
| 3,760,306 A | 9/1973 | Spinner et al. | |
| 5,269,702 A | 12/1993 | Bacher et al. | |
| 2004/0239334 A1 | 12/2004 | Kreager et al. | |

FOREIGN PATENT DOCUMENTS

| | | |
|---|---|---|
| EP | 0 465 845 A2 | 1/1992 |
| WO | WO 02/07265 A1 | 1/2002 |

OTHER PUBLICATIONS

International Search Report for PCT/US2005/044730 dated Apr. 5, 2006.

* cited by examiner

*Primary Examiner*—Stephen E Jones
(74) *Attorney, Agent, or Firm*—RatnerPrestia

(57) ABSTRACT

Signal modules and methods for electrically interfacing with an electronic device are provided. The signal module includes a dielectric and a conductor extending through a surface of the dielectric. The surface of the dielectric is located away from perpendicular relative to an axis of the conductor and is located based on an electromagnetic field produced as a result of a signal flowing through the conductor.

50 Claims, 8 Drawing Sheets

Impedance model results of pins passing through 5 dielectric slabs with 2 sided bevel angles

SIGNAL MODULE WITH REDUCED REFLECTIONS

FIELD OF THE INVENTION

The present invention relates to electronic interfacing and more particularly, an apparatus and method for substantially reducing electromagnetic reflections in a signal interface module.

BACKGROUND OF THE INVENTION

In the manufacture of integrated circuits (ICs) and other electronic devices, testing with automatic test equipment (ATE) is performed at one or more stages of the overall process. IC testing systems typically include a test head and a probe card. Packaged part testing systems typically include a test head and a device under test (DUT) board. The probe card or DUT board includes a pattern of contacts for electrically probing or connecting to portions of an integrated circuit. The test head is configured to drive various contacts of the probe card or DUT board to carry out particular test procedures within the IC. In the course of a test procedure, the test head receives output signals from the IC via the contacts of the probe card or DUT board. The output signals are indicative of electrical characteristics of the IC under test. The probe card or DUT board and the test head are uniquely configured for a particular IC and, in some cases, a particular test procedure. Accordingly, the probe card or DUT board and/or the test head must be changed for different ICs and test procedures.

The test head is electrically coupled to the probe card or DUT board with an interface apparatus. The interface apparatus may be, for example, a zero insertion force socket or a "pogo" unit. A pogo unit engages the test head, or some intermediate coupling structure associated with the test head, and the probe card or DUT board. The pogo unit includes an array of spring-loaded contact pins referred to as Pogo Pins®. The spring pins act as signal and ground conductors, and are arranged to electrically couple contacts on the probe card or DUT board to corresponding contacts on the test head. The spring force of the spring pins helps to maintain uniformity of electrical contact between the various contacts of the probe card or DUT board and the test head. When the test head and probe card or DUT board are engaged with the pogo unit exerting pressure against the spring pins, the spring pins respond with a spring force that enhances coupling pressure. The resilience of the pins generally ensures adequate coupling pressure despite planar deformation of the test head or the probe card or DUT board during a test procedure.

In many applications, the conductors are required to carry signals having very high frequency components, from 100's of MHz to 10 GHz in the near future and to 10's of GHz in the more distant future. Accordingly, the transmission line characteristic impedance of the signal path between the probe card or DUT board and the test head is of prime interest. For optimal signal transfer between the test electronics and the device being tested, the characteristic impedance of all elements in the signal path should be closely matched. Usually, it is desired that all signal paths have the same impedance, for example 28, 50, or 75 Ohms, though it may be required that several different values of characteristic impedance be provided in the same interface.

ATE interface signal modules typically employ dielectric materials to structurally support electrical transmission lines. These dielectric materials provide an electrically insulating boundary between adjacent transmission line elements, but also cause discontinuities in the characteristic impedance along the path of the transmission line. Discontinuities in characteristic impedance along a transmission line can cause undesirable effects that include increased reflection coefficients levels, consequent decreased transmission coefficient levels, both of which are frequency dependent, that causes unleveled channel performance detrimental to the signal integrity of the signal module and its ability to perform ATE signal characterization. In many applications it is thus desirable to remove the reflections of electromagnetic fields as they propagate through the impedance discontinuities caused by the differing dielectric constants.

SUMMARY OF THE INVENTION

The present invention is embodied in a signal module for electrically interfacing with an electronic device. The signal module includes a dielectric and a conductor extending through a surface of the dielectric. The surface of the dielectric is located away from perpendicular relative to an axis of the conductor and is located based on an electromagnetic field produced as a result of a signal flowing through the conductor.

The present invention is also embodied in a method of transmitting an electromagnetic signal. The method includes the step of providing a signal module. The signal module includes a dielectric and a conductor extending through a surface of the dielectric. The surface of the dielectric is away from perpendicular relative to an axis of the conductor and the surface is based on an electromagnetic field produced as a result of a signal flowing through the conductor. The method further includes the steps of providing the electromagnetic signal to one end of the conductor in the signal module and transmitting the signal through the conductor.

The present invention is further embodied in a signal connector. The signal connector includes a dielectric having a countersink provided on each of a first surface and a second surface opposite the first surface. The signal connector also includes a conductor that extends through the countersink of the first surface of the dielectric and the countersink of the second surface of the dielectric. The dielectric provides mechanical support to the conductor. The countersinks are provided at a bevel angle relative to an axis of the conductor and located based on an electromagnetic field produced as a result of a signal flowing through the conductor.

The present invention is further embodied in a signal module. The signal module includes a plurality of spring pins and a first and second retainer cap. Each retainer cap is of dielectric material. Each retainer cap includes a top portion having a plurality of countersinks provided in each of a first surface and a second surface opposite the first surface and a plurality of bores extending between the plurality of countersinks provided in the first surface and the second surface. Each retainer cap also includes a side portion that is coupled to the top portion. The side portion encloses the plurality of spring pins. The plurality of spring pins are disposed in the plurality of bores, respectively. The countersinks are provided at a bevel angle relative to an axis of the conductor and located based on an electromagnetic field produced as a result of a plurality of signals flowing through the plurality of spring pins, respectively.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
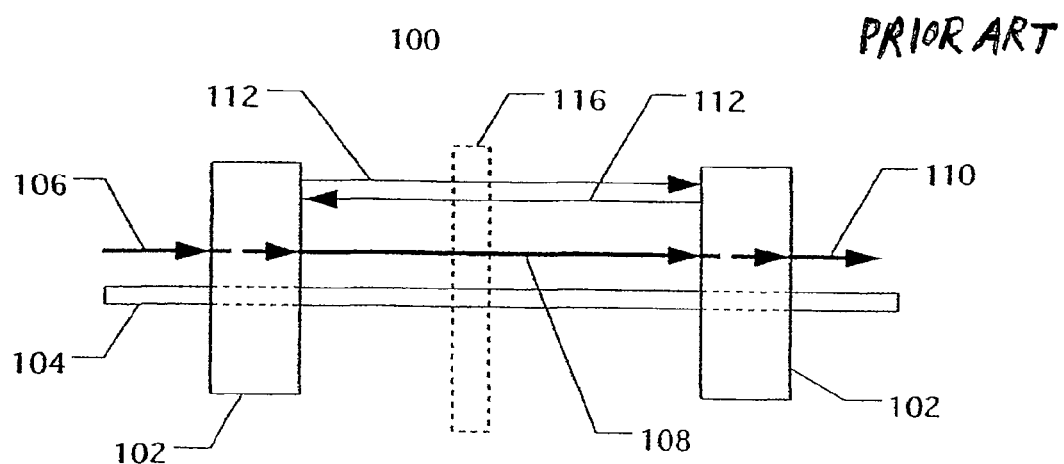
FIG. 1 is a side view of a conventional signal module showing electromagnetic signal propagation and reflection through the conventional signal module.

FIG. 1 describes a conventional ATE interface signal module 100. An ATE interface electromagnetic signal 106 is transmitted through signal module 100 along spring pin 104. The electromagnetic signal propagates in the region 108 surrounding the surfaces of the spring pins, (multiple spring pins not shown) and encounters dielectric caps 102 at the module ends along with any dielectric shims 116 within the signal module.

In the conventional ATE interface signal module, reflections 112 of the electromagnetic signal occur when the electromagnetic signal encounters the boundary interface between the media surrounding spring pin 104 and the dielectric caps 102.

The media surrounding the spring pins is typically air. A typical ATE interface signal module may employ dielectric caps whose dielectric constant is greater than air. This creates a characteristic impedance mismatch, resulting in the electromagnetic reflections 112.

The magnitude of the electromagnetic reflections increase as the dielectric constant of the dielectric caps increase. Additionally, the forward transmission coefficient suffers loss causing decreased transmission through the signal module.

Multiple spring pins (not shown in FIG. 1) passing through dielectric caps 102 may each have electromagnetic reflections 112. The resulting reflections may produce undesirable crosstalk between adjacent spring pins. Thus, the final electromagnetic signal 110 transmitted through the conventional signal module may include transmission loss and crosstalk from adjacent spring pins.

Attempts have been made to match the impedance of the dielectric with that of the media surrounding the spring pins. Attempts to fabricate dielectric caps using materials of very low dielectric constant, for example, Cuming Microwave Corporation RH-10 material, have revealed that the mechanical tensile strength of those materials is not sufficient to rigidly constrain the spring pins.

Efforts to reduce electromagnetic reflections in an ATE interface signal module have attempted to compensate for the capacitive effect of the dielectric cap. For example, the spring pin diameter in a portion of the dielectric cap has been adjusted in an effort to achieve an impedance match.

In "Calculation of an Optimum Transmission Line Taper," IEEE Microwave Theory & Techniques, November 1972, pages 734-739, the diameter of the plunger was gradually changed to compensate for capacitive effect of the dielectric cap. A computer simulation model constructed that computed the required length of the tapered transmission line resulted in requiring an unacceptably long transmission line not capable of fitting within the constrained dimensions of a reasonable ATE signal module.

The present invention produces an electromagnetic impedance match by implementing the condition where the plane of the incident TM (transverse magnetic) field of the electromagnetic wave propagating along the axis of the signal module is parallel with the surface of the dielectric boundary. An angle of the dielectric boundary surface is thus determined based on the electromagnetic field produced as a result of the signal flowing through the signal module. In an ATE signal module, this is desirably accomplished by creating a bevel angle at the boundary of the media between the spring pins and the dielectric caps. By providing the appropriate bevel angle, there are essentially zero reflections between dielectric boundaries.

An exemplary embodiment of the present invention comprises a signal module including a conductor and a low loss dielectric. In an exemplary embodiment, dielectrics 202 and 204 and conductor 208 are shown in FIG. 2.

Figure 2:
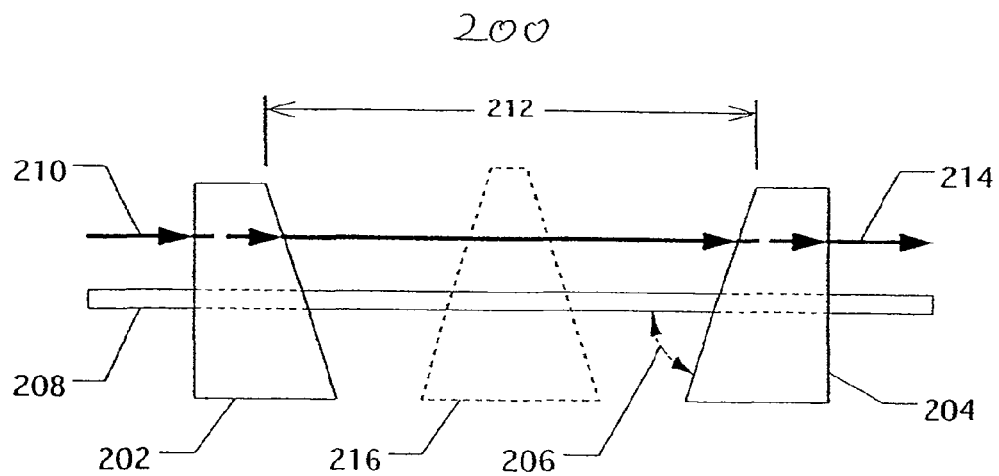
FIG. 2 is a side view of an exemplary signal module in accordance with an exemplary embodiment of the present invention showing electromagnetic signal propagation through the exemplary signal module.

FIG. 2 illustrates a signal module 200 according to an exemplary embodiment of the present invention. The conductor may pass through dielectrics 202 and 204 in signal module 200. Additional dielectrics such as dielectric 216 may also be positioned along the length of conductor to provide further support to the conductor.

An electromagnetic signal 210 may be sent into one end of the exemplary signal module. The electromagnetic signal is an electromagnetic wave that propagates along the axis of conductor 208. The electromagnetic signal desirably passes through dielectrics 202 and 204 without producing reflections in region 212 between dielectrics 202 and 204. Signal 214 that is transmitted out of signal module 200 desirably has no transmission loss from passing through dielectrics 202 and 204.

ATE interface signals typically have a bandwidth in the GHz region. Signal module 200 desirably operates in the frequency region between DC and at least 30 GHz and higher. Exemplary signal module 200 may operate at a substantially higher bandwidth or within a more limited bandwidth. The exemplary signal module is not limited to ATE interface signals and may be used for other applications, such as connectors that include internal dielectric inserts intended to mechanically support electrical conductors within the connector but also obstruct the propagation of electromagnetic signals that pass through them.

Signal module 200 shown here presents dielectric 204 as having one angle 206. This is being shown for illustrative purposes only. In FIG. 2, dielectrics 202 and 204 are at the same bevel angle 206. Although dielectrics 202 and 204 show only one surface with bevel angle 206, in the exemplary embodiment, all surfaces are desirably at a specific bevel angle. Additionally, dielectrics 202 and 204 only show one segment of the specific bevel angle. In practice, the bevel angle is a conical shaped countersink 302 of FIG. 3, which is convenient for fabrication.

Figure 3:
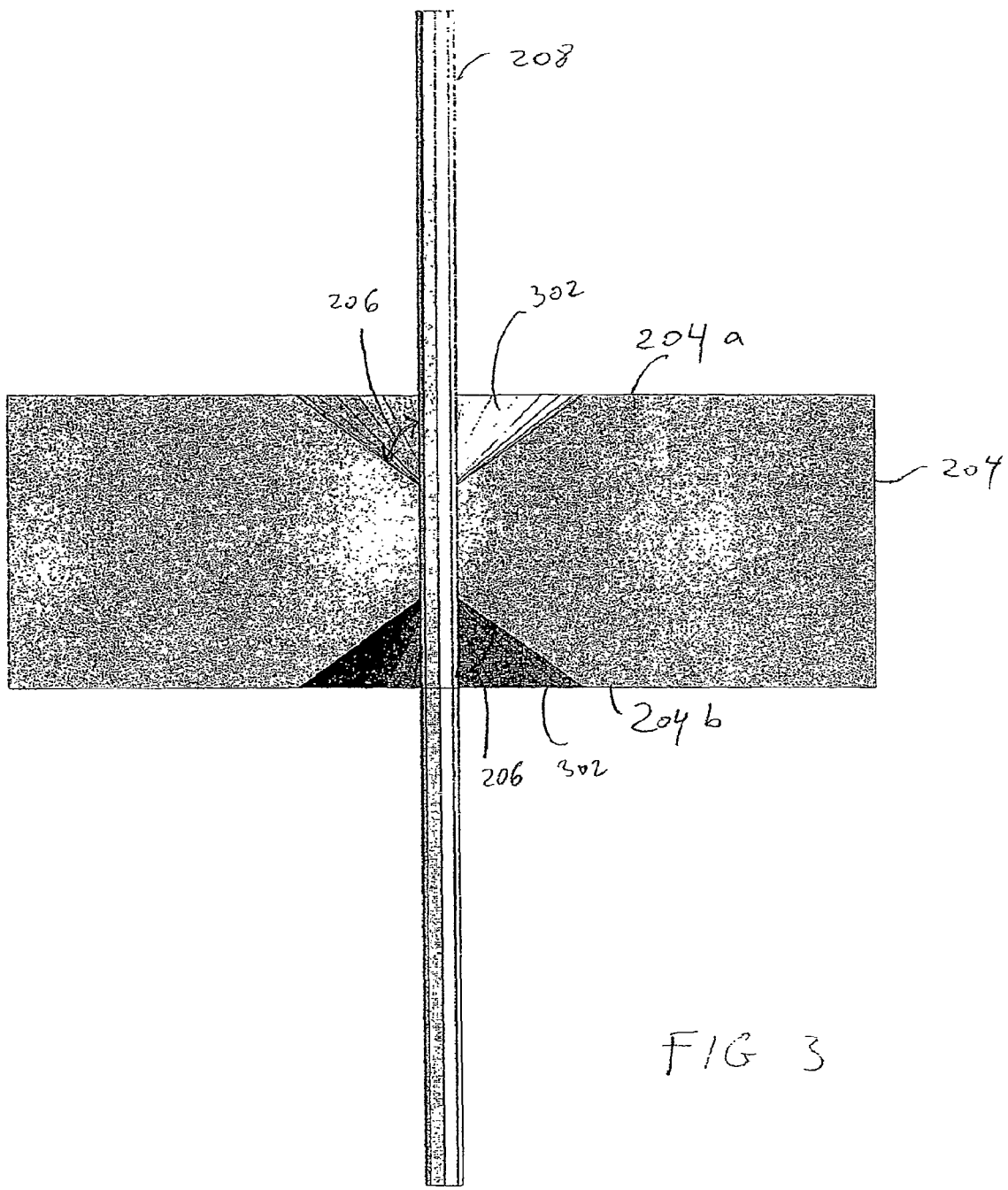
FIG. 3 is a side view of an exemplary dielectric boundary in accordance with an exemplary embodiment of the present invention showing countersinks in the dielectric boundary in a vicinity of a conductor.

As illustrated in FIG. 3, a dielectric 204 has a first surface 204a and a second surface 204b. A conductor 208 passes through first surface 204a having a countersink 302. Countersink 302 is desirably at angle 206 relative to a central axis along the length of conductor 208. Conductor 208 further passes through second surface 204b, also having a countersink 302. It is desirable that surfaces 204a and 204b each have countersinks 302, both at bevel angle 206.

Exemplary conductor 208 may be included in a pseudo-coaxial transmission line comprised of a plurality of conductors. Pseudo-coaxial transmission lines are commonly known by one skilled in the art.

Figure 4:
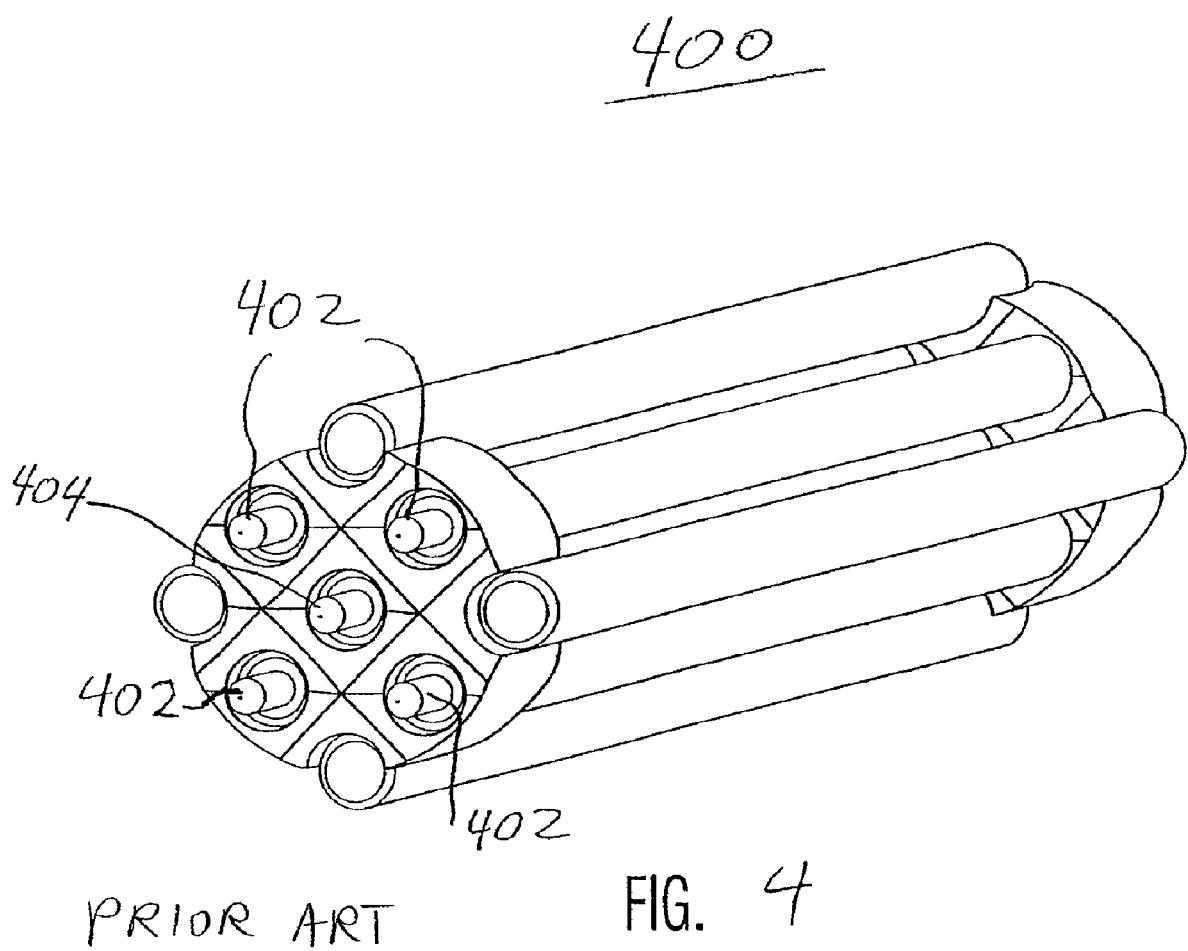
FIG. 4 is a perspective view of a conventional pseudo-coaxial transmission line showing an arrangement of conductors through an end terminal of the pseudo-coaxial transmission line.

FIG. 4 illustrates a known in the art pseudo-coaxial transmission line 400 composed of five parallel spring pins 402 and 404. In this example, center pin 404 carries the electromagnetic signal and the other four spring pins 402, which are arranged to surround center pin 404 are electrically grounded. This is only one arrangement of a pseudo-coaxial transmission line. This and other potentially useful configurations are shown, for example, in Reference Data for Radio Engineers, 4th Edition. New York: International Telephone & Telegraph Corp., 1957. The present invention is not limited to spring pin arrangement 400 or to a pseudo-coaxial transmission line.

The transmission lines used in exemplary signal module 200 typically seek to achieve a characteristic impedance of 50 Ohms. This characteristic impedance matches the impedance of typical coaxial cables, printed circuit boards microstrip transmission lines or other electrical devices that may be attached to the exemplary signal module. Signal module 200 may be designed to achieve other characteristic impedance values.

The characteristic impedance of a transmission line may be governed by the geometric arrangement of the spring pins, the diameter of the spring pins, the spacing distance between spring pins, and the dielectric constant of the media between the pins. The media surround the spring pins, and hence conductor 208 in region 212, is typically air. Other media may include other dielectric medium with a low loss tangent and stable, frequency independent dielectric constant.

Exemplary signal module 200 with conductor 208 may operate with a planar electric field vector from an electromagnetic signal, such as but not limited to TM01 or TE11 wave modes for a circular geometric arrangement of conductors forming a transmission line, or TE10 or TM11 wave modes for a rectangular geometry of conductors forming a transmission line. The exemplary signal module also desirably operates with electromagnetic signals having distorted electric field vector. A distorted TM field vector may occur where conductor 208 is a pseudo-coaxial transmission line or in other configurations.

Dielectrics 202 and 204 may include dielectric material having a dielectric constant between 1 to 5 over a frequency range of DC to at least 30 GHz and higher. The frequency range for which the dielectric constant is desirably between 1 to 5 may be substantially higher. The dielectric constant is desirably constant over a preferred bandwidth. The dielectric constant value and frequency range desirably depends upon the application of the exemplary signal module. The desired dielectric constant value and frequency range may vary with the type of input signal without affecting the scope of the present invention.

In addition to the dielectric constant constraints of dielectrics 202 and 204, the dielectric material also desirably includes the property of a loss tangent less than 0.1 over the frequency range of DC to at least 30 GHz and higher. The frequency range for which the loss tangent is desirably less than 0.1 may be substantially higher. The loss tangent required depends upon the application of the signal module. ATE interface signals may require lower loss tangents than other applications.

Common dielectric materials used in exemplary signal module 200 may include polytetrafluoroethylene, FR4, Ultem® 1000, Rexolite®, polyethylene, polyvinyl-chloride and air. Other materials may be used provided they have a low loss tangent (for example less than 0.1) and dielectric constant suitable for the application requirements. All dielectric materials, including those listed here, exhibit some loss, albeit a small loss that may be considered negligible.

According to the present invention, an electromagnetic impedance match at the boundary of two media with differing dielectric constants may be achieved if the plane of the incident TM field of the electromagnetic wave propagating along the axis of the signal module is parallel with the surface of the dielectric boundary, and the boundary is at a specific bevel angle. This bevel angle is determined from the angle where the electromagnetic reflection approaches a zero value.

The surface of the dielectric of the exemplary embodiment is desirably smooth and contains a straight line parallel to the TM field plane of incidence where they intersect and where the electromagnetic wave propagates along a linear axis. The surface of the dielectric desirably conforms to an isosurface of the TM field for other electromagnetic wave conditions.

The angle where electromagnetic reflections approach a minimum value may be calculated using the principles of a Brewster angle. The Brewster angle is common in the art of optical and quasi-optical systems.

For parallel polarization, the Brewster angle, $\theta_B$, exists where there is an angle of incidence upon the dielectric at which the TM Fresnel reflection vanishes for nonmagnetic and lossless materials. The initial condition is defined by Snell's Law as shown in equation (1).

$$\sqrt{\varepsilon_2}\sin\theta_T = \sqrt{\varepsilon_1}\sin\theta_B \qquad (1)$$

where $\varepsilon_1$ and $\varepsilon_2$ are the dielectric constants of regions 1 and 2 respectively and $\theta_T$ is the refractive angle of region 2.

From simple geometry, it can be shown that $\theta_T = 90° - \theta_B$, it follows that $$\sqrt{\varepsilon_1}\sin\theta_B = \sqrt{\varepsilon_2}\cos\theta_B$$

$$\tan\theta_B = \frac{\sqrt{\varepsilon_2}}{\sqrt{\varepsilon_1}}$$

known as Brewster's Law and typically expressed as below $$\theta_B = \tan^{-1}\left(\frac{\sqrt{\varepsilon_2}}{\sqrt{\varepsilon_1}}\right) \qquad (2)$$

For the exemplary embodiment of the signal module, the bevel angle is dependent upon the dielectric constant of the dielectric, the dielectric constant of the media surrounding the conductor, and the angle of the TM field vector from the electromagnetic signal propagating along the conductor.

The Brewster angle computed by equation 2 above assumes the dielectric media are lossless, i.e. exhibit zero electrical conductivity and are nonmagnetic. The Brewster angle loses its meaning if the dielectric material in region 2 is lossy since it will exhibit a complex valued dielectric constant. The Brewster angle may be modified by specifying the real and imaginary parts of the complex dielectric. The electromagnetic reflection can approach a minimum value if we re-state equation 2 as $$\theta_B = \tan^{-1}\sqrt{(\in_{2R} - j\in_{2I})/\in_1}. \quad (3)$$

This approach is known as the Zenneck Surface Wave when the incident medium is lossless, such as air, which is the medium $\in_1$.

For determining appropriate bevel angles and surfaces for particular applications and configurations of real materials regardless of the loss tangent of the dielectric and the distortion of the TM vector resulting from various configurations, commercially available modeling and simulation tools such as Finite Difference Time Domain solvers with three-dimensional capabilities can be used.

To accommodate distorted electric fields, the bevel angle is desirably further modified to account for the distortion. Therefore, the bevel angle is not a classic Brewster angle, but an angle that accounts for electric field distortion caused by the type of conductor, such as a pseudo-coaxial transmission line. The criteria for an electromagnetic impedance match are those as defined in equation (2) but the implementation desirably requires modification to account for electric field distortion in order to accommodate those criteria.

At the specific bevel angle value, electromagnetic reflections approach zero. The transmission out of the signal module subsequently improves to a high value as it is commonly known from the conservation of energy.

The improvement in transmission is broadband and not dependent upon the signal frequency. Frequency dependence is limited by the frequency dependence of the dielectric material permittivity. For an exemplary embodiment where the conductor is a transmission line, frequency dependence is also limited by the electromagnetic mode cut-off frequency well known to transmission line designers.

Figure 5:
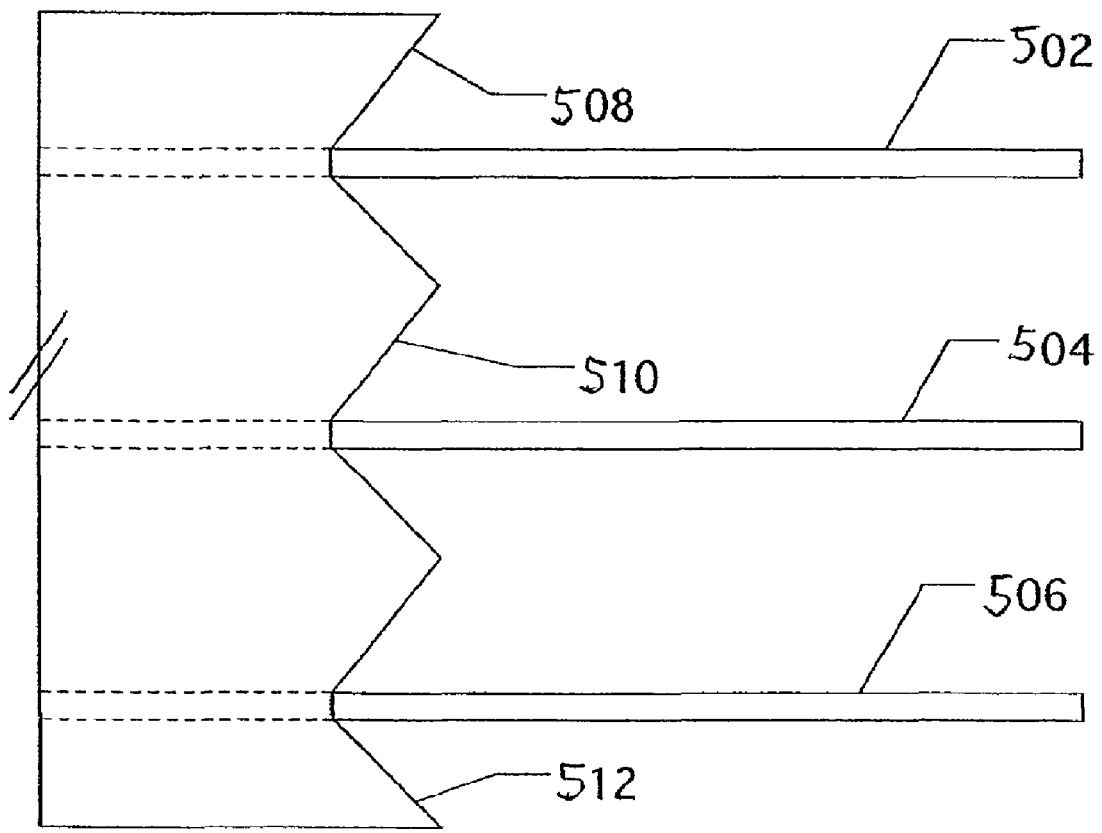
FIG. 5 is a side view section of an exemplary signal module of the present invention showing an arrangement of conductors through a dielectric having bevel angles for each respective conductor.

The present invention may be extended to a signal module with multiple conductors, as shown in FIG. 5. FIG. 5 shows a cross-sectioned portion of one end of a dielectric cap 500. Multiple conductors 502, 504 and 506 extend through the dielectric cap 500 and out of a signal module according to an exemplary embodiment of the present invention.

FIG. 5 shows bevel angles 508, 510 and 512 corresponding to conductors 502, 504, and 506. The bevel angles illustrated here more accurately depict the implementation of bevel angles on the dielectric surface. The bevel angles are desirably countersinks on the dielectric. The multiple countersinks are desirably adjacent to or intersect each other.

The conductors illustrated in the embodiment of FIG. 5 may each represent an individual conductor of, for example, a five-wire a pseudo-coaxial transmission line such as illustrated in FIG. 4 or other transmission lines, or signal carrying connector. The exemplary embodiment is not limited to a device of three conductors. The exemplary signal module may contain any number of conductors in a planar or other suitable arrangement. The conductors may be spaced apart and in such an arrangement to provide an appropriate characteristic impedance match to its connecting devices.

The bevel angle applied to the surface of the dielectric for each respective conductor causes the electromagnetic reflection along each conductor to approach a minimum value. The adjacent channel crosstalk, both even mode and odd mode, decreases since there is no reflection mechanism to contribute to the crosstalk.

In bidirectional signaling, multiple conductor transmission lines carrying any multiplicity of signals simultaneously, the even mode is defined as simultaneous signals propagating in a parallel direction, in contrast to an odd mode where simultaneous signals are propagating in an anti-parallel direction. The exemplary embodiment may include any combination of even and odd mode propagation conditions simultaneously.

It is understood that the invention is not limited to multiple electromagnetic signals propagating in the same direction along multiple conductors, respectively. For example, a first electromagnetic signal may propagate into the end of conductor 502 while a second electromagnetic signal may propagate out of the end of conductor 504. The second electromagnetic signal thus propagates in a direction opposite the first electromagnetic signal.

Different electromagnetic signals with differing electric field vectors may propagate through conductors 502, 504 and 506 respectively. Respective bevel angles 508, 510 and 512 may each be designed for the specific electromagnetic signal and may be of a different angle to remove reflections for the particular electromagnetic signal. This allows manufacture of a signal module suited to a particular application. The resulting signal module will have a minimum of channel cross-talk and a maximum of respective signal transmission.

The invention will next be illustrated by reference to a number of examples. The examples are included to more clearly demonstrate the overall nature of the invention. These examples are exemplary, not restrictive of the invention.

Example 1

Figure 6:
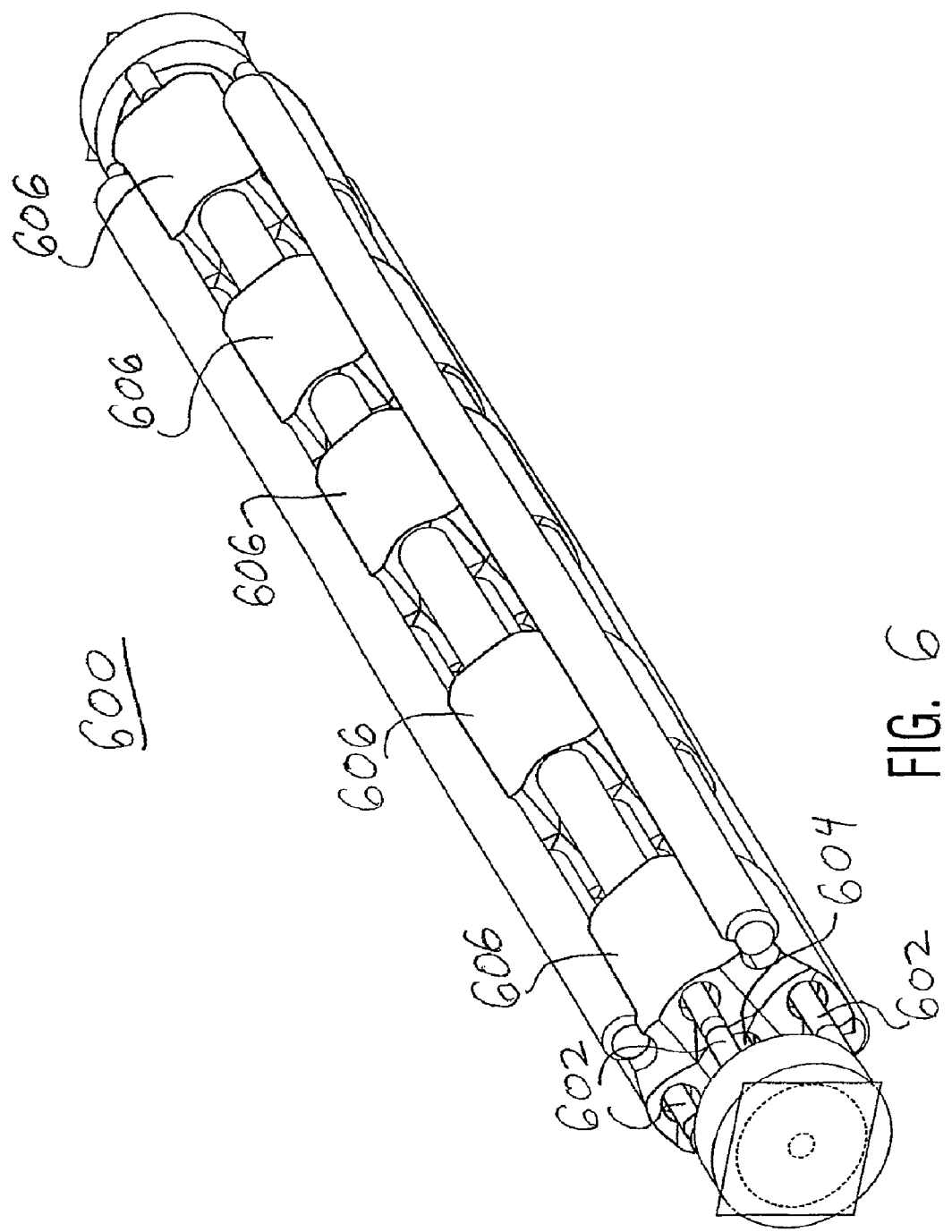
FIG. 6 is a perspective view of an exemplary pseudo-coaxial transmission line in accordance with an exemplary embodiment of the present invention showing five dielectrics with bevel angle countersinks arranged along the to pseudo-coaxial transmission line.

FIG. 6 illustrates an exemplary pseudo-coaxial transmission line 600 with five dielectrics 606 spaced apart from each other along pseudo-coaxial transmission line 600. Each dielectric 606 has a bevel angle countersink (not shown) on both sides of dielectric 606 determined as described above. Pseudo-coaxial transmission line 600 has five spring pins 602 and 604. Center spring pin 604 carries the electromagnetic signal and the other four spring pins 602, which are arranged to surround center pin 604 are electrically grounded.

Figure 7:
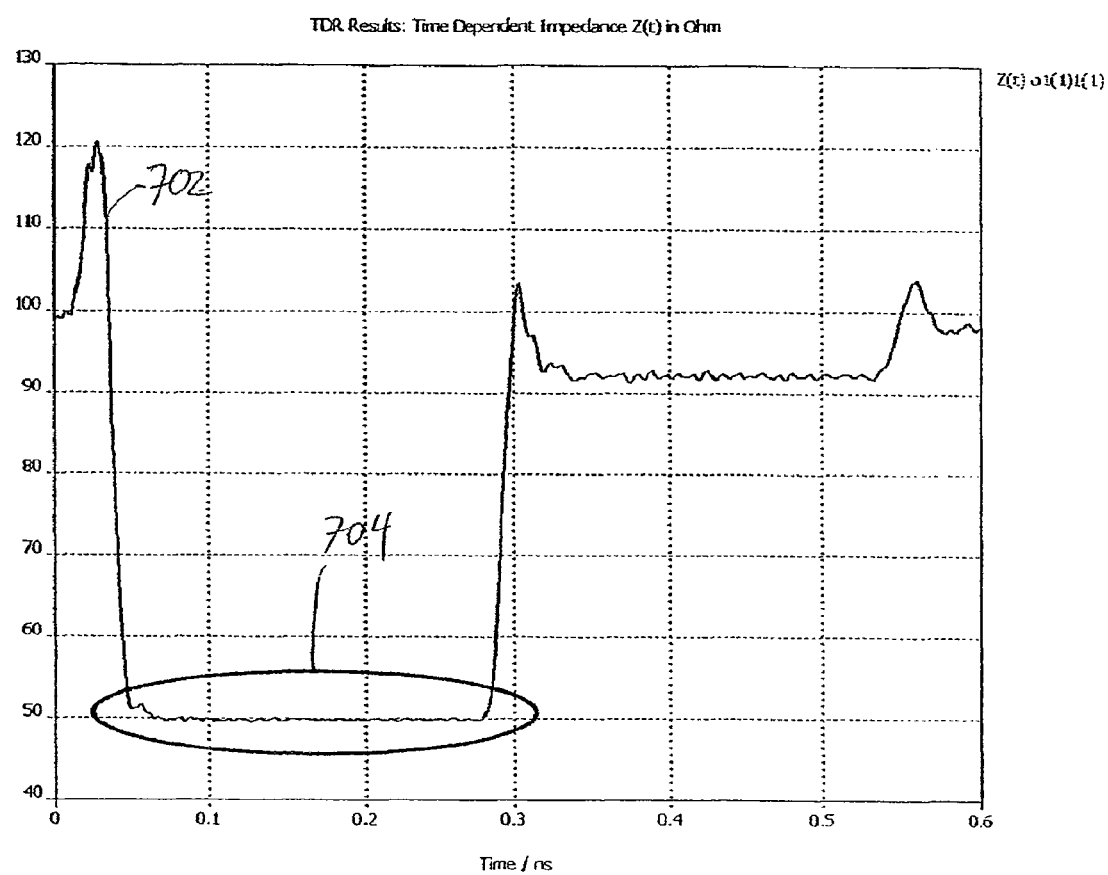
FIG. 7 is a simulation result of the impedance of an electromagnetic signal propagating through the exemplary pseudo-coaxial transmission line in accordance with an exemplary embodiment of the present invention.

Referring now to FIG. 7, results of an impedance model simulation with respect to exemplary pseudo-coaxial transmission line 600 is now described. Impedance model simulation results 702 illustrate the impedance in ohms of an electromagnetic signal propagating through exemplary pseudo-coaxial transmission line 600 versus time in ns. When the electromagnetic signal propagates through exemplary pseudo-coaxial transmission line 600, the impedance is about 50 ohms, as illustrated by region 704. Exemplary embodiment 600 demonstrates that although the electromagnetic signal encounters 10 boundary condition changes (two for each dielectric 606) the bevel angle countersinks on each dielectric significantly reduce an impedance mismatch, thus maintaining the impedance at about 50 ohms.

Example 2

Figure 8A:
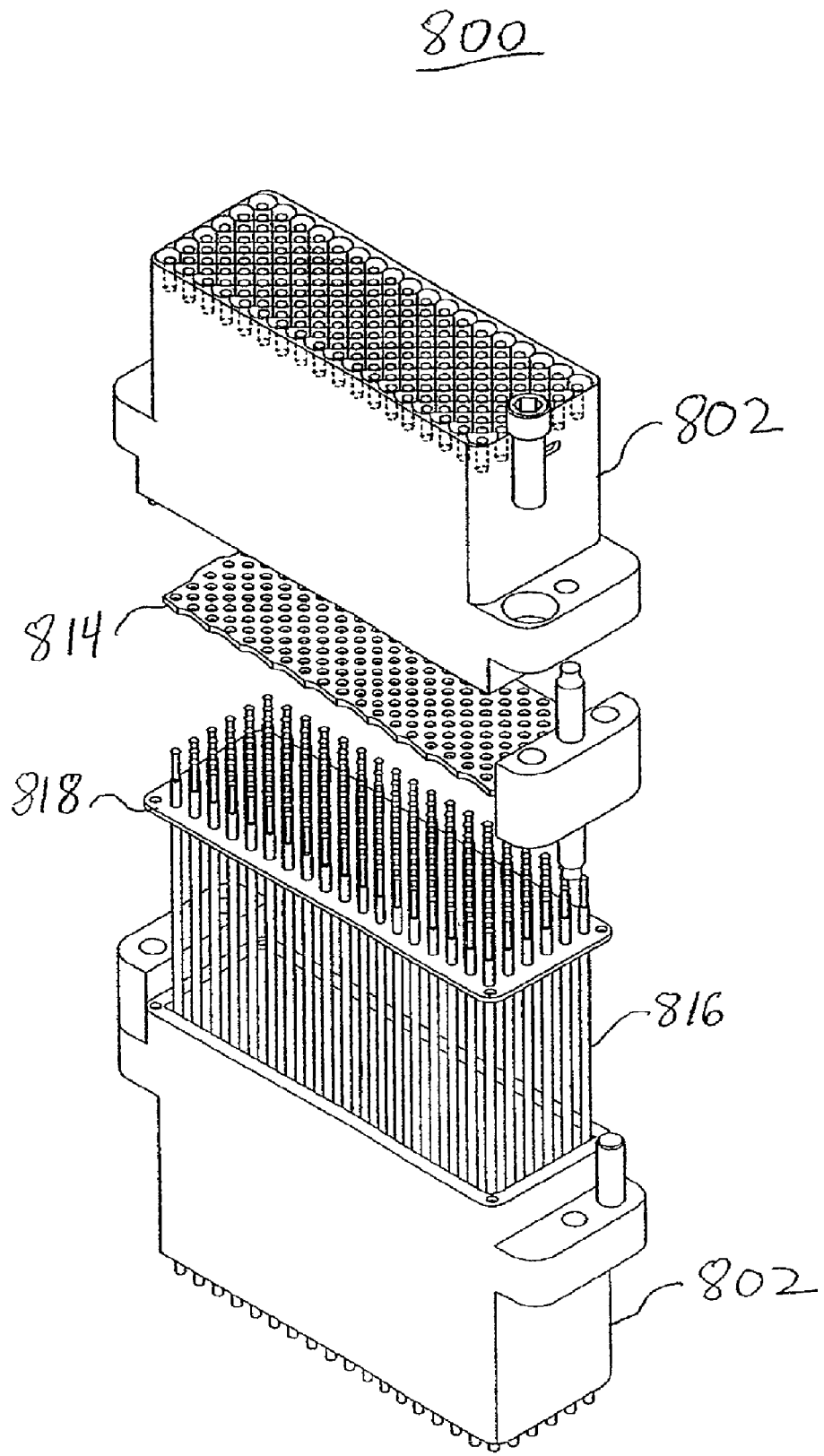
FIG. 8a is a perspective view of an exemplary ATE interface signal module in accordance with an exemplary embodiment of the present invention.

Referring now to FIG. 8a, an exemplary ATE signal interface module 800 with multiple spring pins 816 is now described. A retainer cap 802 of dielectric material covers and supports spring pins 816.

Figure 8B:
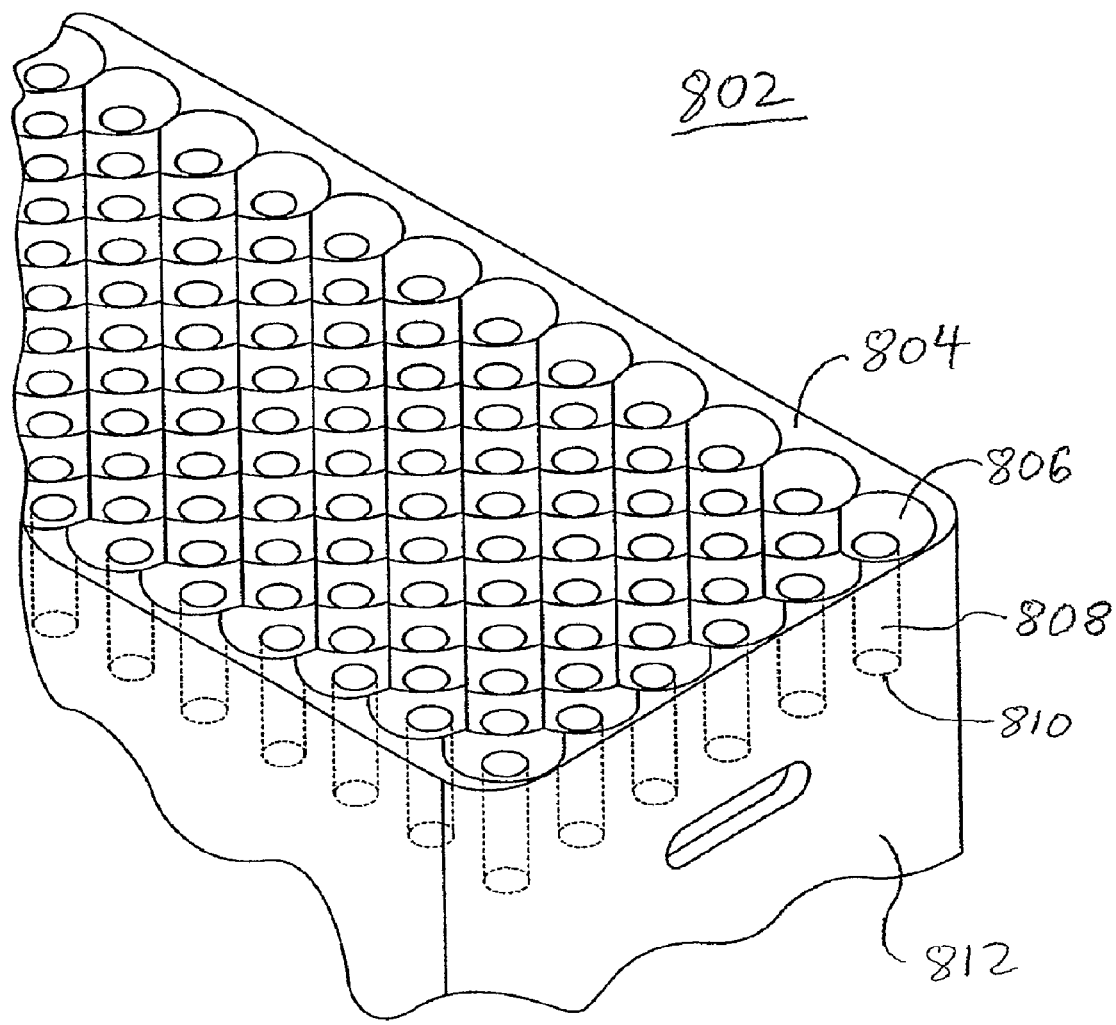
FIG. 8b is a section view of a retainer cap within an exemplary ATE interface in accordance with an exemplary embodiment of the present invention.

A section of retainer cap 802 is further illustrated in FIG. 8b. Retainer cap 802 has a top portion 804 and a side portion 812. A first surface of top portion 804 includes a plurality of bevel angle countersinks 806. A plurality of apertures 808 extends between bevel angle countersinks 806 and a second surface of top portion 804. A second surface 810 of top portion 804 is a flat surface and does not have bevel angle countersinks due to machining limitations.

A bevel angle shim 814 is of dielectric material having a first surface that is flat and a second surface with bevel angle countersinks. Bevel angle shim further includes apertures corresponding to the apertures in the retainer cap 802 and the countersinks of bevel angle shim 814. The first surface of bevel angle shim 814 is disposed adjacent to the second surface 810 of top portion 804 of retainer cap 802. The combination of dielectric retainer cap 802 and bevel angle shim 812 function as one retainer with both surfaces having bevel angle countersinks.

An assembly shim 818 is disposed between side portion 812 of a first retainer cap 802 and a side portion 812 of a second retainer cap 802. Assembly shim 818 has apertures corresponding to the apertures in first retainer cap 802. Assembly shim 818 is desirably of dielectric material with bevel angle countersinks machined on both sides corresponding to the apertures. Assembly shim 818 may provide support to spring pins 816.

A second retainer cap 802 and bevel angle shim 814 as described above are coupled together to function as one retainer with both surfaces having bevel angle countersinks. Both second retainer cap 802 and second bevel angle shim 814 further include apertures that correspond to the apertures in first retainer cap 802.

A plurality of spring pins 816 extend and are supported through the apertures between top portion 804 of first retainer cap 802, first bevel angle shim 814, assembly shim 818, a second bevel angle shim 814 and top portion 804 of a second retainer cap 802. Side portions 812 of first and second retainer caps 802 enclose spring pins 816 within exemplary ATE signal interface module 800.

In exemplary ATE signal interface module 800, all dielectric boundaries are thus provided with countersink bevel angles designed as described above according to an exemplary method of the present invention. Exemplary module 800 thus does not suffer from impedance mismatch.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A signal module for electrically interfacing with an electronic device, said signal module comprising:
a conductor configured to carry an electromagnetic signal; and
a solid support of dielectric material having a depression on a surface of said dielectric material symmetric with respect to an axis of said conductor, said depression having an apex within said solid support, said depression provided at a bevel angle extending from said axis to a wall of said dielectric material which defines said depression,
wherein said conductor extends through said solid support via said apex of said depression,
and wherein said bevel angle is an angle where there is substantially no reflection of said electromagnetic wave at said surface of said dielectric material when said conductor carries said electromagnetic signal.

2. The signal module according to claim 1, wherein said solid support is one of a plurality of solid supports, said plurality of solid supports spaced apart from each other along the axis of said conductor.

3. The signal module according to claim 1, wherein said dielectric material includes a loss tangent less than 0.1 over a DC to 30 GHz frequency range.

4. The signal module according to claim 1, wherein said dielectric material includes a dielectric constant between 1 and 5 that remains constant over a DC to 30 GHz frequency range.

5. The signal module according to claim 1, wherein said conductor is one of at least copper, brass, brass alloys, aluminum, silver, graphite and gold.

6. The signal module according to claim 1, wherein said conductor is surrounded by a medium with low loss tangent and stable dielectric constant.

7. The signal module according to claim 1, wherein said conductor is one of a plurality of conductors, where said conductors are spaced apart from each other and extend through said solid support.

8. The signal module according to claim 1, wherein said bevel angle is calculated from a Brewster angle, said Brewster angle corresponding to a dielectric constant of a medium surrounding the conductor and a dielectric constant of the solid support, modified for distortion of said predetermined electric field vector.

9. The signal module according to claim 1, wherein said bevel angle provides an electromagnetic impedance match at said boundary between said conductor and said solid support.

10. The signal module according to claim 1, wherein said depression includes a countersink having said bevel angle that is provided in said solid support, said countersink located at said boundary between said conductor and said solid support.

11. The signal module according to claim 1, wherein said bevel angle provides a characteristic impedance that substantially matches a characteristic impedance of said electrical device coupled to said signal module.

12. The signal module according to claim 1, said surface of said solid support is one of multiple surfaces, wherein the multiple surfaces have respective bevel angles.

13. The signal module according to claim 1, wherein said bevel angle is one of a plurality of bevel angles for a respective plurality of conductors, said plurality of bevel angles provides a substantial reduction of cross-talk between said respective plurality of electromagnetic signals.

14. The signal module according to claim 1, wherein said conductor is a transmission line.

15. The signal module according to claim 14, wherein said transmission line is a pseudo-coaxial transmission line.

16. The signal module according to claim 1, wherein said bevel angle is one of a plurality of bevel angles for a respective plurality of conductors, wherein said bevel angle for at least one of said respective plurality of conductors is different from the bevel angle of the other respective conductors.

17. The signal module according to claim 16, wherein said electromagnetic signal is one of a plurality of electromagnetic signals, said plurality of conductors configured to transmit said plurality of electromagnetic signals through said respective plurality of conductors, wherein at least one of said electromagnetic signals transmitted through said respective plurality of conductors is different from the electromagnetic signals transmitted through the other respective conductors.

18. The signal module according to claim 17, wherein at least one of said electromagnetic signals transmitted through said respective plurality of conductors propagates in a direction opposite from the electromagnetic signals transmitted through the other respective conductors.

19. The signal module according to claim 1, wherein said conductor carries said electromagnetic signal and said electromagnetic signal is an electromagnetic wave that propagates along the axis of said conductor.

20. The signal module according to claim 19, wherein said depression is oriented based on a predetermined electric field vector corresponding to said electromagnetic wave.

21. The signal module according to claim 20, wherein said predetermined electric field vector is planar.

22. The signal module according to claim 20, wherein said predetermined electric field vector is distorted.

23. A signal module comprising:
a plurality of conductors, at least one configured to carry an electromagnetic signal; and
at least one support of dielectric material, said at least one support having plurality of depressions provided in each of a first surface and a second surface opposite said first surface,
wherein said plurality of conductors are disposed through said at least one support and extend through said plurality of depressions of said first surface and said plurality of depressions of said second surface of said support, respectively, and
each of said depressions are provided at a bevel angle relative to an axis of a respective one of said plurality of conductors, and
wherein said bevel angle is an angle where there is substantially no reflection of said dielectric material when said at least one of said conductors carries said electromagnetic signal.

24. The signal module according to claim 23, said at least one support including a first retainer cap and second retainer cap.

25. The signal module according to claim 24, further comprising a shim of dielectric material disposed between said first and said second retainer caps, said shim comprising:
a plurality of shim depressions provided in each of a first surface and a second surface opposite said first surface of said shim, said plurality of shim depressions corresponding to said plurality of depressions of said first and second retainer caps,
wherein said plurality of conductors are disposed through said shim and extend through said plurality of shim depressions of said first surface of said shim and said plurality of shim depressions of said second surface of said shim, respectively.

26. The signal module according to claim 23, wherein said electromagnetic signal is an electromagnetic wave that propagates along the axis of the respective conductor, said bevel angle is an angle where there is substantially no reflection of said electromagnetic wave at said respective depression.

27. The signal module according to claim 26, wherein said bevel angle provides an electromagnetic impedance match at a respective boundary between a medium surrounding said plurality of conductors and said at least one support.

28. The signal module according to claim 26, wherein said bevel angle provides a characteristic impedance that substantially matches a characteristic impedance of an electrical device coupled to said signal module.

29. A signal connector comprising:
a conductor configured to carry an electromagnetic signal; and
a solid support of dielectric material having a depression provided in each of a first surface and a second surface opposite said first surface, each depression being symmetric with respect to an axis of said conductor, each depression having an apex within said solid support, each depression provided at a bevel angle extending from said axis to a wall of said dielectric material which defines said depression,
wherein said conductor is disposed through said solid support and extends through said apex of said depression of said first surface and said apex of said depression of said second surface, respectively, and
wherein said bevel angle is an angle where there is substantially no reflection of said electromagnetic wave at said surface of said dielectric material when said conductor carries said electromagnetic signal.

30. The signal connector according to claim 29, wherein said solid support is one of a plurality of solid supports, said plurality of solid supports spaced apart from each other along said axis of said conductor.

31. The signal connector according to claim 29, wherein said conductor is one of a plurality of conductors, where said conductors are spaced part from each other and extend through one of a plurality of depressions provided on said first surface of said solid support and one of a plurality of depressions provided on said second surface of said solid support, respectively.

32. The signal connector according to claim 29, wherein said bevel angle provides a characteristic impedance that substantially matches a characteristic impedance of an electrical device coupled to said signal connector.

33. The signal connector according to claim 29, wherein said conductor is a transmission line.

34. The signal connector according to claim 33, wherein said transmission line is a pseudo-coaxial transmission line, said pseudo-coaxial transmission line comprising a signal-carrying conductor that is configured to carry said electromagnetic signal and a plurality of conductors surrounding said signal-carrying conductor, each one of said plurality of conductors being electrically grounded.

35. The signal connector according to claim 29, wherein said electromagnetic wave includes a predetermined electric field vector, said bevel angle is calculated from a Brewster angle, said Brewster angle corresponding to a dielectric constant of a medium surrounding the conductor and a dielectric constant of the solid support, modified for distortion of the predetermined electric field vector.

36. The signal connector according to claim 35, wherein said bevel angle provides an electromagnetic impedance match at respective boundaries between said medium surrounding the conductor and said solid support.

37. A method of transmitting an electromagnetic signal, the method comprising:
(a) providing a signal module which includes:
a conductor configured to carry said electromagnetic signal, and
a solid support of dielectric material having a depression on a surface of said dielectric material symmetric with respect to an axis of said conductor, said depression having an apex within said solid support, said depression provided at a bevel angle extending from said axis to a wall of said dielectric material which defines said depression, said conductor extending through said solid support via said apex of said depression, said bevel angle is an angle where there is substantially no reflection of said electromagnetic wave at said surface of said dielectric material when said conductor carries said electromagnetic signal;

(b) providing said electromagnetic signal to one end of said conductor in said signal module; and (c) transmitting said electromagnetic signal through the conductor.

38. The method according to claim 37, wherein said solid support is one of a plurality of solid supports, said plurality of solid supports spaced apart from each other along said axis of said conductor, so that in step (c) said electromagnetic signal is transmitted through said plurality of solid supports.

39. The method according to claim 37, said surface of said solid support is one of multiple surfaces, wherein the multiple surfaces have respective bevel angles, so that in step (c) said electromagnetic signal is transmitted through said solid support.

40. The method according to claim 37, said bevel angle provides a characteristic impedance such that the characteristic impedance of said electromagnetic signal transmitted through the conductor substantially matches a characteristic impedance of an electrical device coupled to a second end of said conductor.

41. The method according to claim 37, said bevel angle is one of a plurality of bevel angles for a respective plurality of conductors, wherein at least one of said bevel angles for at least one of said respective plurality of conductors is different from the bevel angle of the other respective conductors, said electromagnetic signal is one of a plurality of electromagnetic signals transmitted through said conductors, respectively.

42. The method according to claim 37, said bevel angle is one of a plurality of bevel angles for a respective plurality of conductors, said electromagnetic signal is one of a plurality of electromagnetic signals transmitted through said conductors, respectively, wherein said bevel angle provides a substantial reduction of cross-talk between said respective plurality of electromagnetic signals.

43. The method according to claim 37 and further including the step of calculating said bevel angle from a Brewster angle, said Brewster angle corresponding to a dielectric constant of a medium surrounding the conductor and a dielectric constant of the solid support, modified for distortion of said predetermined electric field vector.

44. The method according to claim 43, said bevel angle provides an electromagnetic impedance match for said electromagnetic signal transmitted at a boundary between said solid support and said medium surrounding the conductor.

45. The method according to claim 37, wherein said conductor is one of a plurality of conductors, where said conductors are spaced apart from each other and extend through said solid support, said electromagnetic signal is one of a plurality of electromagnetic signals transmitted through said conductors, respectively.

46. The method according to claim 45, wherein at least one of said electromagnetic signals transmitted through said conductors propagates in a direction opposite from the electromagnetic signals transmitted through the other respective conductors.

47. The method according to claim 37, wherein the step of providing the electromagnetic signal to one end of said conductor includes providing the electromagnetic signal comprising an electromagnetic wave that propagates along said axis of the conductor.

48. The method according to claim 47, wherein said depression is oriented based on a predetermined electric field vector corresponding to said electromagnetic wave, so that in step (c) said electromagnetic signal is transmitted through said solid support.

49. The method according to claim 48, further comprising the step of providing said electromagnetic signal wherein said predetermined electric field vector is planar.

50. The method according to claim 48, further comprising providing said electromagnetic signal wherein said predetermined electric field vector is distorted.

* * * * *

UNITED STATES PATENT AND TRADEMARK OFFICE
CERTIFICATE OF CORRECTION

| | | |
|---|---|---|
| PATENT NO. | : 7,834,718 B2 | Page 1 of 1 |
| APPLICATION NO. | : 11/721492 | |
| DATED | : November 16, 2010 | |
| INVENTOR(S) | : William Michael Brooks et al. | |

It is certified that error appears in the above-identified patent and that said Letters Patent is hereby corrected as shown below:

At Column 11, line 29, "support having plurality" should read --support having a plurality--

At Column 11, line 36, "respectively, and" should read --respectively,--

Signed and Sealed this
Twenty-fifth Day of January, 2011

David J. Kappos
*Director of the United States Patent and Trademark Office*